(12) United States Patent
Sano et al.

(10) Patent No.: US 10,324,242 B2
(45) Date of Patent: Jun. 18, 2019

(54) OPTICAL COMPONENT AND LIGHT EMITTING DEVICE

(71) Applicant: NICHIA CORPORATION, Anan-shi, Tokushima (JP)

(72) Inventors: Masahiko Sano, Anan (JP); Dai Wakamatsu, Anan (JP); Masami Kumano, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 61 days.

(21) Appl. No.: 15/258,285

(22) Filed: Sep. 7, 2016

(65) Prior Publication Data

US 2017/0067620 A1 Mar. 9, 2017

(30) Foreign Application Priority Data

Sep. 7, 2015 (JP) .................................. 2015-175581
May 10, 2016 (JP) .................................. 2016-094603

(51) Int. Cl.
| | | |
|---|---|---|
| *G02B 5/02* | (2006.01) | |
| *G02B 5/28* | (2006.01) | |
| *H01L 33/46* | (2010.01) | |
| *H01L 33/48* | (2010.01) | |

(52) U.S. Cl.
CPC ........... *G02B 5/285* (2013.01); *G02B 5/0221* (2013.01); *G02B 5/0278* (2013.01); *H01L 33/48* (2013.01); *H01L 33/46* (2013.01); *H01L 2224/73253* (2013.01); *H01L 2933/0091* (2013.01)

(58) Field of Classification Search
None
See application file for complete search history.

(56) References Cited

U.S. PATENT DOCUMENTS

| 9,121,576 B2 * | 9/2015 | Tsutsumi ................ H01L 33/46 |
| 9,373,759 B2 * | 6/2016 | Wilm ...................... H01L 33/46 |
| 2006/0171152 A1 * | 8/2006 | Suehiro .................. H01L 33/56 |
| | | 362/363 |
| 2011/0204405 A1 | 8/2011 | Tsutsumi et al. |

(Continued)

FOREIGN PATENT DOCUMENTS

| JP | 2011-107508 A | 6/2011 |
| JP | 2013-077679 A | 4/2013 |
| JP | 2013-175531 A | 9/2013 |

(Continued)

OTHER PUBLICATIONS

TFVM-15C03-405, retrieved from "https://www.global-optosigma.com/en_jp/Catalogs/gno/?from=page&pnoname=TFVM&ccode=W3009&dcode=&gnoname=TFVM-15C03-405" on Feb. 5, 2018.*

*Primary Examiner* — Britt D Hanley
(74) *Attorney, Agent, or Firm* — Hunton Andrews Kurth LLP

(57) ABSTRACT

An optical component includes a phosphor member, an optical filter arranged over the phosphor member at a light extraction side of the phosphor member, and a light scattering member arranged on over the optical filter. An excitation spectrum of the phosphor member has a first local maximum wavelength in the visible region and a second local maximum wavelength in the ultraviolet region. The optical filter is configured to reflect a portion of light at the first local maximum wavelength and a portion or all of light at the second local maximum wavelength.

22 Claims, 4 Drawing Sheets

(56) References Cited

U.S. PATENT DOCUMENTS

2013/0221389 A1  8/2013  Yamamuro
2014/0362885 A1  12/2014  Sakuta et al.

FOREIGN PATENT DOCUMENTS

| JP | 2013-197279 A | 9/2013 |
| WO | 2010-044239 A1 | 4/2010 |
| WO | 2013-147195 A1 | 10/2013 |

\* cited by examiner

OPTICAL COMPONENT AND LIGHT EMITTING DEVICE

CROSS-REFERENCE TO RELATED PATENT APPLICATIONS

The present application claims the benefit of Japanese Patent Applications No. 2015-175581, filed on Sep. 7, 2015, and No. 2016-094603, filed on May 10, 2016. The entire disclosures of Japanese Patent Applications No. 2015-175581 and No. 2016-094603 are incorporated by reference herein.

BACKGROUND

Technical Field

The present disclosure relates to an optical component and a light emitting device.

Description of Related Art

A light emitting device having a light emitting element, a phosphor plate adhered to a light emitting surface of the light emitting element, and a white resin covering lateral surfaces of the light emitting element has been known (for example, Japanese Unexamined Patent Application Publication No. 2013-77679).

When the conventional light emitting devices are observed from the above (i.e., observed from the light-extraction surface side that is a viewing side) in a state of the light emitting element is not lit (hereinafter may be referred to as "(in a) non-lighting state"), a fluorescent color of a phosphor member is observed in the region where the phosphor member is provided.

SUMMARY

Accordingly, an object of the certain embodiments is to provide an optical component and a light emitting device in which in a non-lighting state of the light emitting element, the color of region where a phosphor member is provided can be different from the fluorescent color of the phosphor member, as viewed from above the light emitting device.

The optical component according to certain embodiments includes a phosphor member, an optical filter arranged over the phosphor member at a light extraction side of the phosphor member, and a light scattering member arranged over the optical filter. An excitation spectrum of the phosphor member has a first local maximum wavelength in the visible region and a second local maximum wavelength in the ultraviolet region. The optical filter is configured to reflect a portion of light at the first local maximum wavelength and a portion or all of light at the second local maximum wavelength.

The light emitting device according to certain embodiments includes a light emitting element, a phosphor member to emit fluorescent light when exited by light from the light emitting element, an optical filter arranged over the phosphor member at a light extraction side of the phosphor member, and a light scattering member arranged over the optical filter. An excitation spectrum of the phosphor member has a first local maximum wavelength in the visible region and a second local maximum wavelength in the ultraviolet region. The optical filter is configured to reflect a portion of light at the first local maximum wavelength and a portion or all of light at the second local maximum wavelength.

DETAILED DESCRIPTION

Preferred embodiments of the present invention will be described below with reference to the accompanying drawings. The embodiments are intended as illustrative of a light emitting device and an optical component used for it to give a concrete form to technical ideas of the present invention, and the scope of the invention is not limited to those described below. Particularly, the sizes, materials, shapes, and the relative positions of the members described in examples are given as an example and not as a limitation to the scope of the invention unless specifically stated. The sizes and the positional relationships of the members in each of the drawings are occasionally exaggerated for ease of explanation.

The relation between the color names and the chromaticity coordinates, the relation between the range of wavelength of light and the color name of single color light, and the like conform to JIS Z8110. In the present specification, the term "white" refers to light in a region represented by chromaticity coordinates according to JIS Z 8110 where x=0.20 to 0.50 and y=0.20 to 0.45.

First Embodiment

Figure 1:
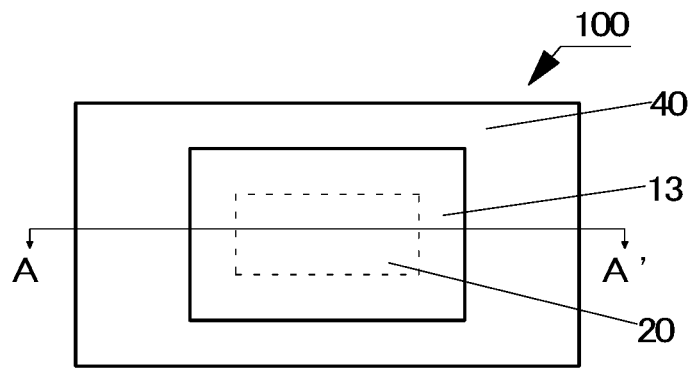
FIG. 1 is a schematic top view of a light emitting device according to a first embodiment.
Figure 2:
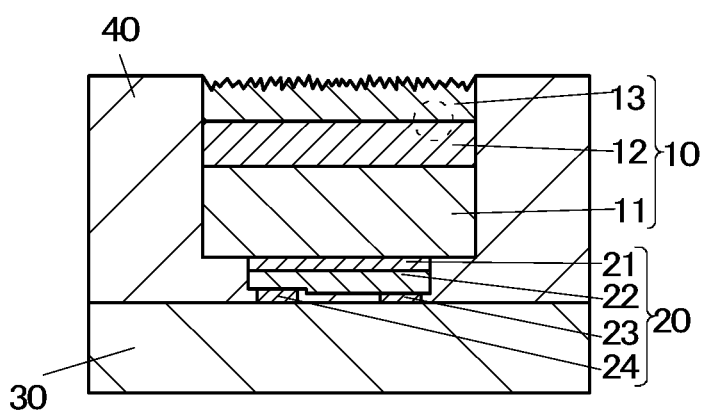
FIG. 2 is a schematic cross sectional view of the light emitting device taken along line A-A' of FIG. 1.

FIG. 1 is a schematic top view (i.e., a diagram seen from a viewing side that is a light extraction side) of a light emitting device 100 according to a first embodiment. FIG. 2 is a schematic cross sectional view of the light emitting device 100 taken along line A-A' of FIG. 1.

As shown in the FIGS. 1 and 2, the light emitting device 100 includes a light emitting element 20 and an optical component 10. The optical component 10 includes a phosphor member 11, an optical filter 12 arranged over the phosphor member at a light extraction side of the phosphor member 11, and a light scattering member 13 arranged over the optical filter 12. An excitation spectrum of the phosphor member 11 has a first local maximum wavelength in the visible region and a second local maximum wavelength in the ultraviolet region. The optical filter 12 is configured to reflect a portion of light at the first local maximum wavelength and a portion or all of light at the second local maximum wavelength.

With this arrangement, in a non-lighting state, when the light emitting device 100 is observed from the viewing side, the appearance color of the optical component 10 can be set to a desired color that is different from the color of the fluorescent light emitted from the phosphor member 11.

Generally, in a light emitting device having a phosphor member, another member may be absent between the observer and the phosphor member, or a member to scatter light may be disposed between the observer and the phosphor member. Accordingly, in a non-lighting state, when the phosphor member is viewed from the viewing side, fluorescent light generated by external light such as sunlight and illumination light (such as CIE standard illuminant D65) being incident on the phosphor member is observed. In other words, the color that observer recognizes in the non-lighting state as an appearance color of the optical member is a fluorescent color of the phosphor member, and other colors are not recognized. However, for some viewers, the fluorescent color of the phosphor member observed in the non-lighting state may be undesirable. Also, according to the usage of the optical component, the appearance color of the optical component in the non-lighting state may be preferably a different color than the fluorescent color of the phosphor member.

Accordingly, in the first embodiment, an optical filter 12 configured to reflect a portion of light of a first local maximum wavelength and a portion or all of light of a second local maximum wavelength is arranged over the phosphor member 11 whose excitation spectrum has the first local maximum wavelength in the visible region and the second local maximum wavelength in the ultraviolet region. With this arrangement, a portion of light at the first local maximum wavelength is reflected by the optical filter 12 to the viewing side, while a portion of light at the first local maximum wavelength that penetrates the optical filter 12 is wavelength-converted by the phosphor member 11 and then emitted to the viewing side via the optical filter 12. That is, in the non-lighting state, light (fluorescent light) emitted to the viewing side via the optical filter 12 as well as light (a portion of light at the first local maximum wavelength) reflected by the optical filter 12 to the viewing side can also be recognized by the observer. Generally, in the case where a phosphor member also has a maximum wavelength in the ultraviolet region (second local maximum wavelength) in its excitation spectrum, even light at the first local maximum wavelength is reflected, the phosphor member may emit by light at the second local maximum wavelength, and the fluorescent light may be strongly recognized at the viewing side. Meanwhile, in the first embodiment, a portion or all of light at the second local maximum wavelength is reflected by the optical filter 12, so that emission of the phosphor member 11 can be reduced. However, in the case where the optical filter 12 is simply disposed over the phosphor member 11, the fluorescent light and a portion of light at the first local maximum wavelength are difficult to mix well and further, depending on the viewing angle, light reflected by the optical filter 12 may be observed as glare. Accordingly, in the first embodiment, the light scattering member 13 is arranged over the optical filter 12. With this arrangement, light (fluorescent light) emitted through the optical filter 12 toward the viewing side and light (light at the first local maximum wavelength included in external light) reflected by the optical filter 12 to the viewing side can be scattered by the light scattering member 13 and thus can be mixed.

Due to the above reasons, in the light emitting device 100, in the non-lighting state, when the light emitting device is viewed from the viewing side, the color of the region where the phosphor member 11 is provided can be made in a desired color that is different from the fluorescent color of the phosphor member 11.

Second Embodiment

Figure 3:
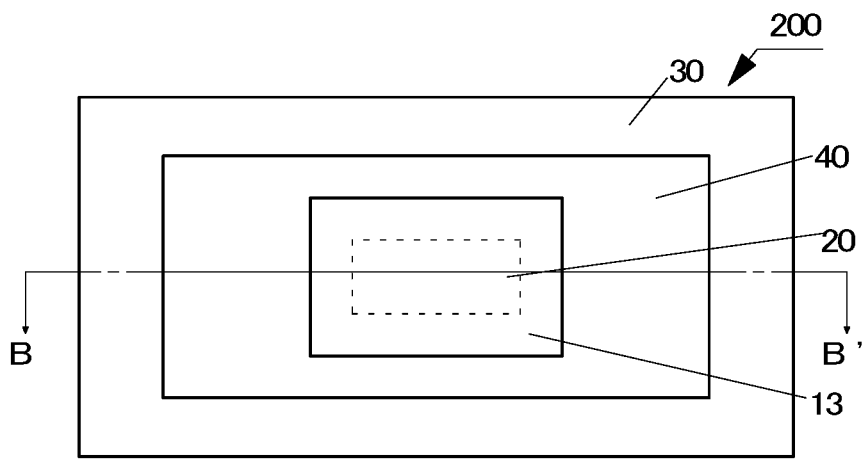
FIG. 3 is a schematic top view of a light emitting device according to a second embodiment.
Figure 4:
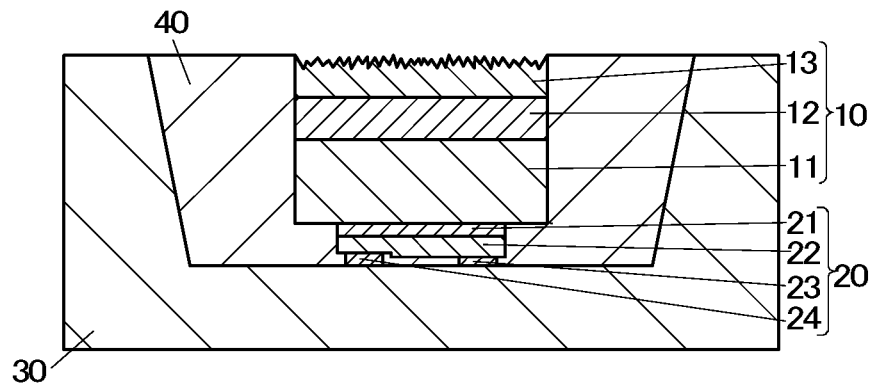
FIG. 4 is a schematic cross sectional view of the light emitting device taken along line B-B' of FIG. 3.

FIG. 3 is a schematic top view of a light emitting device 200 according to a second embodiment. FIG. 4 is a schematic cross sectional view of the light emitting device 200 taken along line B-B' of FIG. 3. The semiconductor light emitting device 200 has a substantially similar configuration as described in the first embodiment except for those described below.

In the light emitting device 200, a base body 30 defines a recess with an opening and a light emitting element 20 and an optical component 10 are disposed in the recess. Further, a light-shielding member 40 is disposed in the recess to fill a space between the light emitting element 20 and the base body 30 and between the optical component 10 and the base body 30.

In the second embodiment, effects similar to that obtained in the first embodiment can be obtained. Further, according to the second embodiment, regions other than the upper surface of the optical component 10 can be easily shielded from light.

Third Embodiment

Figure 5:
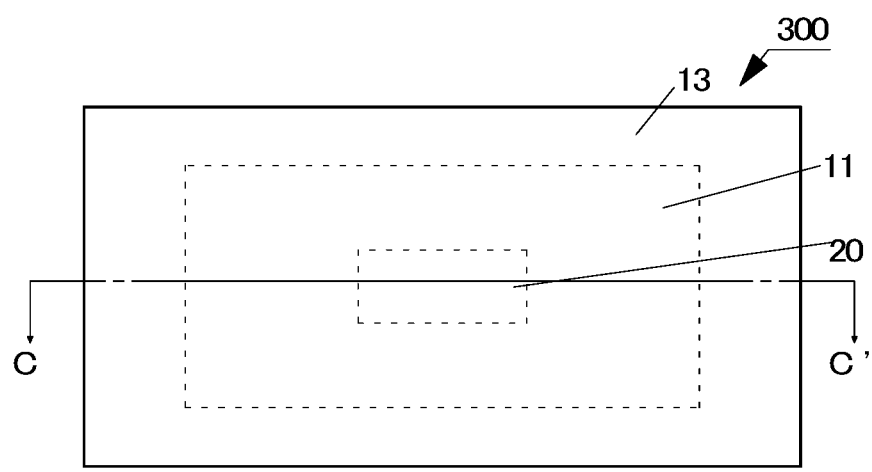
FIG. 5 is a schematic top view of a light emitting device according to a third embodiment.
Figure 6:
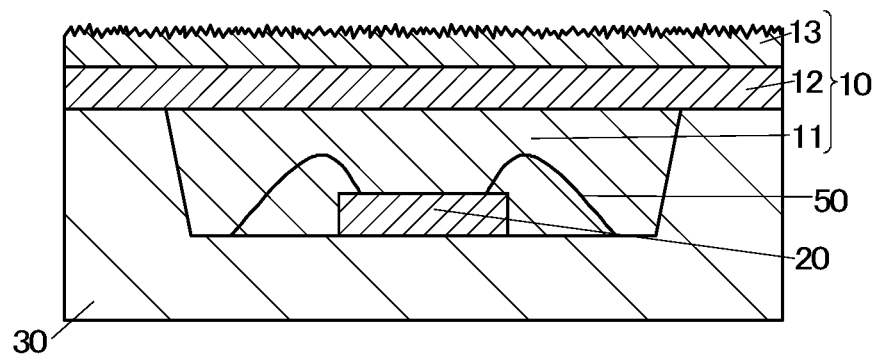
FIG. 6 is a cross sectional view of the light emitting device taken along line C-C' of FIG. 5.

FIG. 5 is a schematic top view of a light emitting device 300 according to a third embodiment. FIG. 6 is a schematic cross sectional view of the light emitting device taken along line C-C' of FIG. 5. The semiconductor light emitting device 300 has a substantially similar configuration as described in the first embodiment except for those described below.

In the light emitting device 300, a base body 30 defines a recess with an opening and a light emitting element 20 is disposed in the recess. A phosphor member 11 is disposed in the recess of the base body 30 so as to cover the light emitting element 20 and an optical filter 12 is disposed to cover the opening of the recess. Further, a light scattering member 13 is disposed over the optical filter 12. The light emitting element 20 is electrically connected to the base body 30 via wires 50.

In the third embodiment, effects similar to that obtained in the first embodiment can be obtained. Further, a larger area with respect to the light emitting element 20 can be provided for the phosphor member 11, so that light extraction efficiency of the light emitting device can be improved.

In the third embodiment, the phosphor member 11 is made of resin that contains a phosphor and is filled in the recess. Thus, the phosphor member 11 can be easily formed. In the third embodiment, the optical filter 12 is also disposed on the upper surface of the base body 30, but the optical filter 12 can be disposed to cover at least the opening of the recess.

The main components of the light emitting devices 100, 200, and 300 will be described below. In the present specification, the viewing side of each of the light emitting devices 100, 200, and 300 (e.g., upper side in FIG. 2) is indicated as "upper side" and the opposite side (e.g., lower side in FIG. 2) is indicated as a "lower side".

Light Emitting Element 20

The light emitting element 20 is to excite the phosphor member 11. For the light emitting element 20, for example, a light emitting diode (LED) chip or a laser diode (LD) chip can be used, and of those, an LED chip is preferably used. The use of an LED chip for the light emitting element 20 can facilitate spreading light from the light emitting element 20, so that when the light emitting element 20 is observed from the viewing side, occurrence of unevenness in the emission can be reduced. In the first embodiment, an LED chip emitting blue light and including nitride semiconductors is employed. In the present specification, an "LED chip emitting blue light" refers to an LED chip that has an emission peak wavelength in a range of 435 nm to 480 nm.

The light emitting element 20 at least includes a semiconductor layered body 22, and a p-electrode 23 and an n-electrode 24 are disposed on the semiconductor layered body 22. At this time, it is preferable that, as shown in FIG. 2, the p-electrode 23 and the n-electrode 24 are respectively formed on surfaces at a same side of the light emitting element 20, and the light emitting element 20 is mounted on the base body 30 in a face-down manner. With this arrangement, the upper surface of the light emitting element 20 can be flat, so that the phosphor member 11 can be arranged above and in close proximity to the light emitting element 20, so that miniaturization of the light emitting device 100 can be attained. In the first embodiment, the light emitting element 20 has a growth substrate 21, but the growth substrate 21 may be removed.

Phosphor Member 11

The phosphor member 11 can be excited by light from the light emitting element 20 to emit fluorescent light. An excitation spectrum of the phosphor member 11 has a first local maximum wavelength in the visible region and a second local maximum wavelength in the ultraviolet region. In the case where a plurality of maximum wavelengths are in the visible region, a largest maximum wavelength is indicated as the first local maximum wavelength, and the case where a plurality of maximum wavelengths are in the ultraviolet region, a largest maximum wavelength is indicated as the second local maximum wavelength. Further, "ultraviolet region" as used in the present specification refers to that included in the sunlight on the ground, which is typically in a wavelength band of 300 nm or more in the ultraviolet region.

Figure 7:
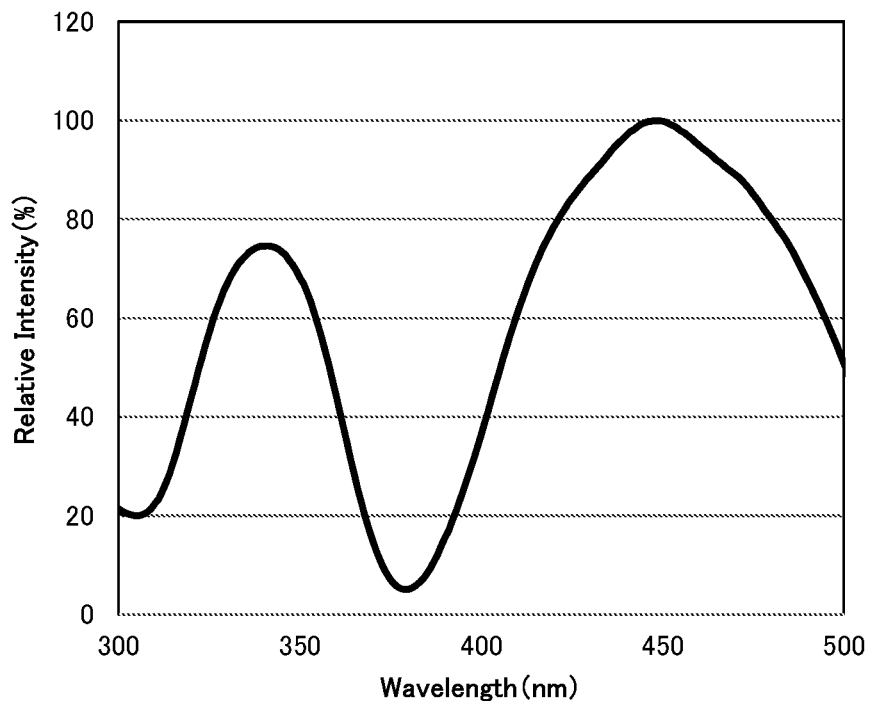
FIG. 7 shows excitation spectrum of a YAG-based phosphor.

Now, the first local maximum wavelength and the second local maximum wavelength will be described, taking an example of a yttrium aluminum garnet-based (YAG-based) phosphor. As shown in FIG. 7, the YAG-based phosphor has maximum values in spectrum at 340 nm and 450 nm. That is, in the YAG-based phosphor, the first local maximum wavelength is 450 nm and the second local maximum wavelength is 340 nm.

The phosphor member 11 may be formed by sintering a phosphor, or formed by containing a phosphor in a base material such as resin.

Such sintered article formed by sintering a phosphor can be formed by sintering only a phosphor or by sintering a mixture of a phosphor and a sintering aid. In the case where a phosphor member 11 is made of a phosphor and a sintering aid, an inorganic material such as silicon oxide, aluminum oxide, or titanium oxide is preferably used as a sintering aid. With this arrangement, discoloration and/or deformation of the sintering aid due to light and/or heat can be reduced even in the light emitting element 20 of high power output.

The phosphor member 11 formed by containing a phosphor in a base material can be formed such that a phosphor is contained in a base material having fluidity and then the base material containing the phosphor is cured. For example, the phosphor member 11 as shown in FIG. 6 can be formed by filling the recess of the base body with a resin containing a phosphor before curing and then curing it. The phosphor member 11 can also be formed such that a resin containing a phosphor before curing is directly applied on the lower surface of the optical filter 12 by using screen printing method or the like, and then is cured. Thus, the need for a step of connecting the optical filter 12 and the phosphor member 11 can be eliminated, so that productivity of the optical component 10 can be improved.

The phosphor can be selected variously according to a desired fluorescent color or the like. Examples of yellow phosphors include garnet-based phosphors such as yttrium aluminum garnet-based (YAG-based) phosphors and lutetium aluminum garnet-based (LAG-based) phosphors. Examples of green phosphors include β-sialon-based phosphors and thiogallate-based phosphors. Examples of red phosphors include nitride-based phosphors such as α-sialon-based phosphors and fluoride-based phosphors such as $K_2SiF_6$:Mn.

In the first embodiment, a sintered mixture of a sintering aid containing aluminum oxide and a YAG-based phosphor is formed in a plate-shape and used for the phosphor member 11. With the use of sintered mixture, the phosphor can be dispersed relatively uniformly, so that the amount of the phosphor contained in the phosphor member 11 can be easily adjusted by adjusting the thickness of the phosphor member 11 (e.g., length of the phosphor member 11 in up-down direction in FIG. 2). With this arrangement, appearance color of the light emitting device can be easily adjusted.

In the first embodiment, the light emitting element 20 and the phosphor member 11 are disposed in close proximity in the light emitting device 100, but the light emitting element 20 and the phosphor member 11 can be spaced from each other via an optical fiber, for example.

Optical Filter 12

The optical filter 12 is configured to reflect a portion of light of a first local maximum wavelength and a portion or all of light of a second local maximum wavelength, and to allow light from the phosphor member 11 to pass through.

Light at the first local maximum wavelength reflected by the optical filter 12 to the viewing side is light of wavelength band that can excite the phosphor member 11. In other words, of the visible light included in external light, the wavelength band of light that is reflected by the optical filter 12 to the viewing side and the wavelength band that can excite the phosphor member 11 overlap at least in part. With this arrangement, light at the first local maximum wavelength is reflected by the optical filter 12 to the viewing side, and excitation light that reaches the phosphor member 11 is reduced. Thus, fluorescent light emitted to the viewing side can be reduced. Further, a portion or all light at the second local maximum wavelength in the ultraviolet region is reflected by the optical filter 12. With this arrangement, excitation light that reaches the phosphor member 11 can be reduced, thus, fluorescent light emitted to the viewing side can be reduced. Accordingly, a desired color can be easily obtained.

The optical filter 12 is preferably configured such that a transmittance of peak wavelength (a largest wavelength in the case of plurality of maximum wavelengths) of fluorescent light of the phosphor member 11 in the visible region is higher than a transmittance at the first local maximum wavelength (excitation light). That is, it is preferable that the optical filter 12 mainly reflects light of a wavelength corresponding to the excitation spectrum, and mainly allows fluorescent light to pass through. With this arrangement, a degradation in the optical output of the light emitting device can be reduced.

Further, in this case, a phosphor member 11 having a relatively narrow half band width of the excitation spectrum is preferably used. For example, in the case of using a phosphor member 11 that has an excitation spectrum of a wide half band width and a broad spectrum of the entire visible range, in order to facilitate adjusting of color in the non-lighting state, light of wavelength in all wavelength range of visible light can be reflected by the optical filter 12. However, in this case, in the state of the light emitting element 20 emitting light (hereinafter may be referred to as "(in a) lighting state"), both light emitted from the light emitting element 20 and fluorescent light emitted from the phosphor member 11 are reflected by the optical filter 20 to a direction opposite to the viewing side, resulting in a reduction in the optical output of the light emitting device 100. Thus, using a phosphor member 11 whose excitation spectrum has a relatively narrow half band width, together with an optical filter 12 configured to reflect light of wavelength corresponding to the excitation spectrum while allowing fluorescent light to pass through, degradation in the optical output of the light emitting device can be reduced. The half band width of the excitation spectrum of the phosphor member 11 can be 200 nm or less, preferably 150 nm or less. Examples of phosphor member 11 having a narrow half band width of the excitation spectrum in the visible region include garnet-based phosphors such as YAG-based phosphors and LAG-based phosphors, nitride-based phosphors such as β-sialon-based phosphors and α-sialon-based phosphors, fluoride-based phosphors such as $K_2SiF_6$:Mn-based phosphors, and quantum dot phosphors.

In the first embodiment, the optical filter 12 is configured to, in a direction perpendicular to main surfaces of the phosphor member 11 (i.e., a flat upper surface and a flat lower surface that are in parallel to each other), mainly allow yellow light that is the fluorescent color of the phosphor member 11 to pass through and mainly reflect blue light (i.e., a portion of visible light included in an external light) that is a complementary color with respect to the fluorescent color. More specifically, a dielectric multilayer film is formed so that in a direction perpendicular to the main surface of the optical filter 12, approximately 100% of light at the first local maximum wavelength (light of 450 nm) and light at the second local maximum wavelength (light of 340 nm) are reflected, and approximately 100% of light of a wavelength band (wavelength band of 530 nm or more) that includes yellow light is allowed to pass through.

In the first embodiment, the reflectance and the transmittance of the optical filter 12 can be applied not only to light from above the optical filter 12 but also to light from below the optical filter 12. Meanwhile, the optical filter 12 has a high angle dependency to incident light, so that even in the case where the optical filter 12 is configured to reflect blue light perpendicularly incident on the optical filter 12, blue light obliquely incident on the optical filter 12 is relatively easily transmitted therethrough. Therefore, even if the optical filter 12 is designed to reflect blue light that is a portion of visible light to be reflected to the viewing side and also light emitted from the light emitting element 20, in the lighting state, blue light obliquely incident on the lower surface of the optical filter 12 is still transmitted through the optical filter 12 and is extracted to the viewing side. That is, even in the case where the optical filter 12 is designed to reflect approximately 100% of blue light in a direction perpendicular to the main surface of the optical filter 12, in the lighting state, light is incident on the lower surface of the optical filter 12 from various directions, so that light from the light emitting element 20 can be extracted to the viewing side. Accordingly, even in the case as described above, in the lighting state, mixed color light of light from the light emitting element 20 and the fluorescent light can be obtained.

Alternatively, an optical filter 12 having a reflectance of light at the first local maximum wavelength that is incident on the upper surface of the optical filter 12 at a predetermined angle is lower than a reflectance of light at the second local maximum wavelength that is incident on the upper surface of the optical filter 12 at the predetermined angle can be used. In this case, a light emitting element 20 having an emission peak wavelength at or near the first local maximum wavelength is used. That is, the optical filter 12 that has a reflectance of light having a wavelength near the emission peak wavelength of the light emitting element 20 lower than a reflectance of light at the second local maximum wavelength in the ultraviolet region. With this arrangement, fluorescent light emitted toward the viewer side in the non-lighting state can be reduced to some degree while in the lighting state, light from the light emitting element 20 that is not wavelength-converted by the phosphor member can be easily transmitted. In this configuration, for example, the optical filter 12 can be designed so that the reflectance of light of 450 nm that is the first local maximum wavelength and is perpendicularly incident to the upper surface of the optical filter is approximately 30%, and the reflectance of light of 340 nm that is the second local maximum wavelength and is perpendicularly incident to the upper surface of the optical filter 12 is approximately 85%.

Figure 8:
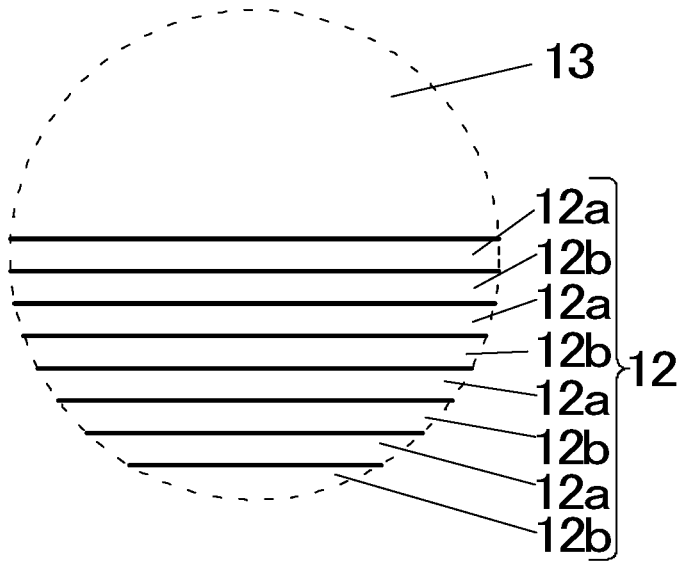
FIG. 8 is an enlarged view of a part enclosed by a broken line in FIG. 2.

In the first embodiment, the optical filter 12 is, as shown in FIG. 8, made of a dielectric multilayer film in which a plurality of low refractive index films 12a and high refractive index films 12b are alternatively layered. Examples of the materials of the dielectric multilayer film include silicon oxide, titanium oxide, aluminum oxide, niobium oxide, and zirconium oxide. In the first embodiment, a dielectric multilayer film in which a plurality of silicon oxide films and niobium oxide films are alternatively layered is used as the optical filter 12. Each layer of the dielectric multilayer film can be formed with a thickness and number of pairs appropriately determined in view of refractive index to light to be reflected.

It is preferable that the optical filter 12 be formed covering the entire upper surface of the phosphor member 11, and the light scattering member 13 be also covering the entire upper surface of the optical filter 12. With this arrangement, color-unevenness of the optical component 10 can be reduced.

Figure 9:
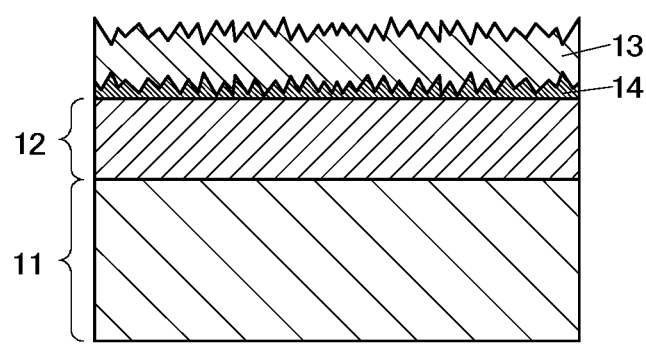
FIG. 9 is a schematic cross sectional view of a first variant example of an optical component.

In the first embodiment, the optical filter 12 is directly disposed on the flat lower surface of the light scattering member 13. With this arrangement, adjusting of the thickness of each layer of the optical filter 12 can be facilitated. Also, a member such as an adhesive material is not applied between the light scattering member 13 and the optical filter 12, so that degradation in the light extraction efficiency can be reduced. Alternatively, as shown in FIG. 9, the optical filter 12 and the light scattering member 13 can be connected via an adhesive material 14.

Light Scattering Member 13

Figure 10:
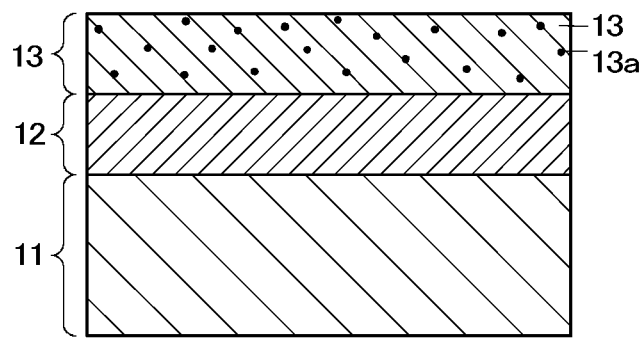
FIG. 10 is a schematic cross sectional view of a second variant example of an optical component.

The light scattering member 13 is light-transmissive to visible light, and is configured to scatter light from above and below. In the first embodiment, the light scattering member 13 is a light-transmissive material having a roughened upper surface and a flat lower surface. Other than the above, for example, as shown in FIG. 9, the light scattering member 13 may be a light-transmissive material having a roughened upper and lower surfaces (first variant example). With this arrangement, when the optical component 10 is viewed from above, the color of the region provided with the phosphor member 11 can be easily made in white, which can be applicable for various purposes. Also, as shown in FIG. 10, a light-transmissive material containing light scattering particles 13a (second variant example) can be used.

Examples of the light-transmissive material include glass, sapphire, and resin. In the case of using a light-transmissive material having roughened surface(s), glass is preferable for its easiness in processing. Examples of the light scattering particles 13a include silicon oxide, aluminum oxide, and titanium oxide.

In the case of using a light-transmissive material whose upper surface or the like being roughened, the surface roughness (Ra) of the light-transmissive material is preferably 50 nm or greater, more preferably 100 nm or greater. With this arrangement, scattering of light from the optical filter 12 can be facilitated, so that color-unevenness of the optical component 10 in the non-lighting state can be reduced. Further, the surface roughness of the light-transmissive material can be preferably 1 µm or less. With this arrangement, in the case of the light-transmissive material having a relatively small thickness, occurrence of defects in the light-transmissive material can be reduced, so that decrease in mechanical strength can be reduced.

In the case of using a light-transmissive material that containing a light scattering particles 13a for the light scattering member 13, the content of the light scattering particles 13a in the light scattering member 13 can be preferably 1% by weight or greater, more preferably 3% by weight or greater. With this arrangement, scattering of light from the optical filter 12 can be facilitated, so that color-unevenness can be reduced. The content of the light scattering particles 13a in the light scattering member 13 can be preferably 30% by weight or less. Accordingly, degradation in the light extraction efficiency can be reduced.

Base Body 30

Base body 30 is for mounting a light emitting element 20. The base body 30 includes a supporting part and a pair of wiring portions arranged on an upper surface of the supporting part. The pair of wiring portions respectively corresponds to a p-electrode 23 and an n-electrode 24 of the light emitting element 20. The light emitting element 20 is provided in a state of being electrically connected to the wiring portions of the base body 30. In FIG. 2, the base body 30 in a flat-plate shape having an upper surface and a lower surface substantially in parallel to each other, but as shown in FIGS. 4 and 6, a base body defining a recess in its upper surface may be used. The base body 30 preferably has light shielding property against light in a visible region. With this arrangement, portions below the light emitting element 20 can also be shielded, so that unintended external light can be prevented from being incident on the phosphor member 11.

The supporting part is preferably electrically insulating and having good light resistance property and heat resistant property. Examples of the material of the supporting part include thermoplastic resins such as polyphthalamide and thermosetting resins such as epoxy resins and silicone resins, respectively contain light scattering particles. For the light scattering particles, a similar material as described above can be used, and with the use of a higher content of the light scattering particles, a light shielding base body 30 in which transmission of light is largely reduced. The wiring portions are preferably made of a metal material.

Light-Shielding Member 40

The light-shielding member 40 is configured to prevent external light from entering the phosphor member 11 from regions other than the region where the optical filter 12 is disposed. In the first embodiment, the light-shielding member 40 is disposed covering the regions except for the upper surface and the lower surface of the phosphor member 11. More specifically, the light-shielding member 40 is disposed covering the lateral sides of the phosphor member 11 and the lateral sides of the light emitting element 20. With this arrangement, unintended excitation of the phosphor member 11 by external light can be prevented.

The light-shielding member 40 can be made of any appropriate material that can shield external light. For example, ceramic or resin that contains light scattering particles can be used. In particular, resin that contains light scattering particles can be easily formed into a desired shape, so that preferably used for the light-shielding member 40. For the materials of the light scattering particles and the resin, similar materials as described in the base body 30 can be used.

It is preferable that, in a cross sectional view, the upper surface of the light-shielding member 40 is at substantially same height or higher than the upper surface of the optical filter 12. With this arrangement, external light desired to be reflected by the optical filter 12 can be prevented from directly entering the phosphor member 11.

When the light emitting device 100 in the non-lighting state is viewed from the viewing side (at least when viewed from a direction approximately perpendicular to the upper surface of the phosphor member), the region provided with the phosphor member 11 preferably appears white. That is, the region provided with the phosphor member 11 is preferably designed so that when a viewer observes the phosphor member 11 through the optical filter 12 and the light scattering member 13, the appearance color of the region having the phosphor member 11 is recognized as white. With this arrangement, the appearance color of the light emitting device 100 can be made applicable for various purposes.

Wire 50

The wires 50 are for electrically connecting the light emitting element 20 and the base body 30. In the third embodiment, a p-electrode 23 and an n-electrode 24 of the light emitting element 20 are disposed on upper surface of the semiconductor layered body 22 and a pair of wires 50 is connected to the n-electrode 24 and the p-electrode 23, respectively. Examples of the material of the wires 50 include metals such as gold, silver, copper, platinum, and aluminum. The diameter of the wires 50 can be appropriately determined according to the purpose and the usage.

The light emitting devices described in the embodiments above can be used in various applications, including light sources for lighting, light sources for display devices, light sources for flash devices, or the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. An optical component comprising:
   a phosphor member;
   an optical filter arranged over the phosphor member at a light extraction side of the phosphor member; and
   a light scattering member arranged over the optical filter;
   wherein
   an excitation spectrum of the phosphor member has a first local maximum wavelength in a range of 435 nm to 480 nm and a second local maximum wavelength in the ultraviolet region, and
   the optical filter is configured to reflect a portion of light at the first local maximum wavelength and at least a portion of light at the second local maximum wavelength, and
   a reflectance of an external light at the first local maximum wavelength that is perpendicularly incident to an upper surface of the optical filter is lower than a reflectance of the external light at the second local maximum wavelength that is perpendicularly incident to the upper surface of the optical filter.

2. The optical component according to claim 1, wherein the light scattering member is a light-transmissive material having a roughened upper surface.

3. The optical component according to claim 1, wherein a reflectance of light at the first local maximum wavelength incident at a predetermined angle with respect to an upper surface of the optical filter is smaller than a reflectance of light at the second local maximum wavelength incident at the predetermined angle.

4. The optical component according to claim 3, wherein the optical filter is a dielectric multilayer film.

5. The optical component according to claim 1, wherein the optical filter covers an entire upper surface of the phosphor member and the light scattering member covers an entire upper surface of the optical filter.

6. The optical component according to claim 1, wherein the light scattering member is directly disposed on the optical filter.

7. A light emitting device comprising:
a light emitting element;
a phosphor member to emit fluorescent light when exited by light from the light emitting element;
an optical filter arranged over the phosphor member at a light extraction side of the phosphor member; and
a light scattering member arranged over the optical filter; wherein
the light emitting element has an emission peak wavelength in a range of 435 nm to 480 nm, and
an excitation spectrum of the phosphor member has a first local maximum wavelength in a range of 435 nm to 480 nm and a second local maximum wavelength in the ultraviolet region, and
the optical filter is configured to reflect a portion of light at the first local maximum wavelength and at least a portion of light at the second local maximum wavelength, and
a reflectance of an external light at the first local maximum wavelength that is perpendicularly incident to an upper surface of the optical filter is lower than a reflectance of the external light at the second local maximum wavelength that is perpendicularly incident to the upper surface of the optical filter.

8. The light emitting device according to claim 7, wherein the light emitting element has an emission peak wavelength at or near the first local maximum wavelength, and
a reflectance of light at the first local maximum wavelength incident at a predetermined angle with respect to an upper surface of the optical filter is smaller than a reflectance of light at the second local maximum wavelength incident at the predetermined angle.

9. The light emitting device according to claim 8, wherein the phosphor member is arranged over the light emitting element and is covered by a light-shielding member except for an upper surface and a lower surface of the phosphor member.

10. The light emitting device according to claim 7, wherein the light scattering member is a light-transmissive material having a roughened upper surface.

11. The light emitting device according to claim 9, wherein when the light emitting device is viewed from above while the light emitting element is in a non-lighting state, a region provided with the phosphor member is white.

12. The light emitting device according to claim 10, wherein the light-transmissive material is glass.

13. The light emitting device according to claim 12, wherein the light scattering member is directly disposed on the optical filter.

14. The light emitting device according to claim 12, wherein the light scattering member has a surface roughness (Ra) in a range of 50 nm to 1 μm.

15. The light emitting device according to claim 7, further comprising a base body defining a recess provided with an opening, wherein
the light emitting element is disposed in the recess;
the phosphor member is disposed in the recess to cover the light emitting element; and
the optical filter is disposed to close the opening of the recess.

16. The light emitting device according to claim 15, wherein the light scattering member is a light-transmissive material having a roughened upper surface.

17. The light emitting device according to claim 15, wherein when the light emitting device is viewed from above while the light emitting element is in a non-lighting state, a region provided with the phosphor member is white.

18. The light emitting device according to claim 7, wherein when the light emitting device is viewed from above while the light emitting element is in a non-lighting state, a region provided with the phosphor member is white.

19. The light emitting device according to claim 7, wherein the light emitting element is a blue light emitting element and the phosphor member contains a yellow phosphor.

20. The light emitting device according to claim 19, wherein the yellow phosphor is a YAG-based phosphor.

21. The optical component according to claim 1, wherein the optical filter is configured such that a transmittance of peak wavelength of fluorescent light of the phosphor member in a visible region is higher than a transmittance at the first local maximum wavelength.

22. The light emitting device according to claim 7, wherein the optical filter is configured such that a transmittance of peak wavelength of fluorescent light of the phosphor member in a visible region is higher than a transmittance at the first local maximum wavelength.

* * * * *